United States Patent
Hutton et al.

(10) Patent No.: US 7,509,618 B1
(45) Date of Patent: Mar. 24, 2009

(54) METHOD AND APPARATUS FOR FACILITATING AN ADAPTIVE ELECTRONIC DESIGN AUTOMATION TOOL

(75) Inventors: Michael Hutton, Mountain View, CA (US); Yean-Yow Hwang, Palo Alto, CA (US); David Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 655 days.

(21) Appl. No.: 10/844,285

(22) Filed: May 12, 2004

(51) Int. Cl.
   *G06F 17/50* (2006.01)
(52) U.S. Cl. ............ 716/18; 716/1; 716/2; 716/3; 716/4; 716/5; 716/16
(58) Field of Classification Search ........ 716/1–4, 716/16, 18; 714/38; 711/137, 170; 703/4, 703/22
See application file for complete search history.

(56) References Cited

U.S. PATENT DOCUMENTS

| | | | | |
|---|---|---|---|---|
| 5,761,484 | A * | 6/1998 | Agarwal et al. | 716/16 |
| 5,838,954 | A * | 11/1998 | Trimberger | 716/16 |
| 6,114,873 | A * | 9/2000 | Sahraoui et al. | 326/39 |
| 6,215,327 | B1 * | 4/2001 | Lyke | 326/41 |
| 6,668,312 | B2 * | 12/2003 | Aubury | 711/170 |
| 6,678,646 | B1 * | 1/2004 | McConnell et al. | 703/22 |
| 6,836,877 | B1 * | 12/2004 | Dupenloup | 716/18 |
| 6,848,029 | B2 * | 1/2005 | Coldewey | 711/137 |
| 6,954,910 | B2 * | 10/2005 | Teig et al. | 716/3 |
| 6,988,256 | B2 * | 1/2006 | Teig et al. | 716/7 |
| 7,017,043 | B1 * | 3/2006 | Potkonjak | 713/176 |
| 7,028,281 | B1 * | 4/2006 | Agrawal et al. | 716/12 |
| 7,038,490 | B1 * | 5/2006 | Singh et al. | 326/41 |
| 7,084,951 | B2 * | 8/2006 | Silverbrook | 355/18 |
| 7,100,141 | B1 * | 8/2006 | Ratchev et al. | 716/16 |
| 7,171,633 | B1 * | 1/2007 | Hwang et al. | 716/2 |
| 7,194,723 | B1 * | 3/2007 | Hwang et al. | 716/17 |
| 7,219,048 | B1 * | 5/2007 | Xu | 703/19 |
| 7,246,340 | B1 * | 7/2007 | Van Antwerpen et al. | 716/18 |
| 7,249,329 | B1 * | 7/2007 | Baeckler et al. | 716/3 |
| 7,254,801 | B1 * | 8/2007 | Borer et al. | 716/16 |
| 7,263,673 | B1 * | 8/2007 | McElvain et al. | 716/3 |
| 7,337,100 | B1 * | 2/2008 | Hutton et al. | 703/13 |
| 7,373,631 | B1 * | 5/2008 | Yuan et al. | 716/18 |
| 2002/0062463 | A1 * | 5/2002 | Hines | 714/38 |
| 2002/0169784 | A1 * | 11/2002 | Cha et al. | 707/102 |
| 2003/0154061 | A1 * | 8/2003 | Willis | 703/4 |
| 2003/0217248 | A1 * | 11/2003 | Nohl et al. | 712/208 |
| 2006/0031789 | A1 * | 2/2006 | Gedamu et al. | 716/1 |
| 2006/0036426 | A1 * | 2/2006 | Barr et al. | 703/22 |
| 2007/0171105 | A1 * | 7/2007 | Madurawe | 341/106 |

OTHER PUBLICATIONS

Baradaran et al., "Compiler reuse analysis for the mapping of data in FPGAs with RAM blocks", 2004, Field-programmable technology, Proceedings, IEEE International Conference on, pp. 145-152.*

(Continued)

*Primary Examiner*—Helen Rossoshek
(74) *Attorney, Agent, or Firm*—L. Cho (57) ABSTRACT

A method for designing systems on field programmable gate arrays (FPGAs) includes caching design information from a compilation of a system design. The design information is utilized in a compilation of a subsequent system design.

36 Claims, 6 Drawing Sheets

OTHER PUBLICATIONS

Kadambi et al., "Accelerating CFD applications by improving cached data reuse", Mar. 12-14, 1995, System theory, Proceedings of the Twenty-seventh Southeastern Symposium on, pp. 120-124.*

Chen et al.; "Maximal reduction of lookup-table based FPGAs"; Sep. 7-10, 1992; Design Automation Conference, 1992. Euro-VHDL '92, Euro-DAC '92. European; Inuani et al.; pp. 224-229.*

Inuani et al.; "Re-synthesis in technology mapping for heterogeneous FPGAs"; Oct. 5-7, 1998; Computer Design: VLSI in Computers and Processors, 1998. ICCD '98. Proceedings., International Conference on; pp. 202-204 ☐☐.*

Singh et al.; "Incremental placement for layout-driven optimizations on FPGAs"; Nov. 10-14, 2002; Computer Aided Design, 2002. ICCAD 2002. IEEE/ACM International Conference on; pp. 752-759.*

Jason et al.; "Structural gate decomposition for depth-optimal technology mapping in LUT-based FPGA designs"; Apr. 200; ACM Transitions on Design Automation of Electronic Systems (TODAES); vol. 5; Issue 2; Publisher: ACM.*

Ling et al.; "FPGA technology mapping: a study of optimality"; Jun. 2005; DAC'05; Proceedings of the 42nd annual conference on Design automation; Publisher: ACM.*

* cited by examiner

METHOD AND APPARATUS FOR FACILITATING AN ADAPTIVE ELECTRONIC DESIGN AUTOMATION TOOL

FIELD OF THE INVENTION

The present invention relates to electronic design automation (EDA) tools for designing systems on programmable logic devices (PLDs). More specifically, the present invention relates to a method and apparatus for facilitating an adaptive EDA tool capable of utilizing previously determined design information.

BACKGROUND

FPGAs may be used to implement large systems that include millions of gates and megabits of embedded memory. Of the tasks required in managing and optimizing a design, synthesis, placement, and routing available resources on the FPGA can be the most challenging and time consuming. In order to satisfy placement and timing specifications, several iterations are often required to determine how components are to be mapped and placed on the target device and which routing resources to allocate to the components. The complexity of large systems often requires the use of EDA tools to manage and optimize their design onto physical target devices. Automated mapping, placement, and routing algorithms in EDA tools perform the time consuming task of mapping, placement, and routing of components onto physical devices.

Many of the automated mapping, placement, and routing algorithms in the EDA tools are heuristic in nature. In generating a satisfactory system design, one may be required to repeat one or more of the synthesis, placement, and routing processes several times. Although the design process is automated, generating the satisfactory system design may still be time consuming, which is undesirable. For example, sub-processes such as re-synthesis, wild-card generation, and timing analysis often require a significant amount of compilation time. Although a significant investment in time is required to generate the results for these sub-processes, current EDA tools do not utilize these results in future compilations.

Thus, what is needed is an efficient and effective method and apparatus for facilitating an adaptive EDA tool that is capable of utilizing previously determined design information.

SUMMARY

According to an embodiment of the present invention, design information from a compilation of a system design is cached and utilized in a compilation of a subsequent system design. In one embodiment, a functional decomposition template that includes a functional representation of logic and a structural representation of the logic is cached. The cached design information may be utilized to speed-up re-synthesis and to reduce the overall compilation time of the subsequent system design.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
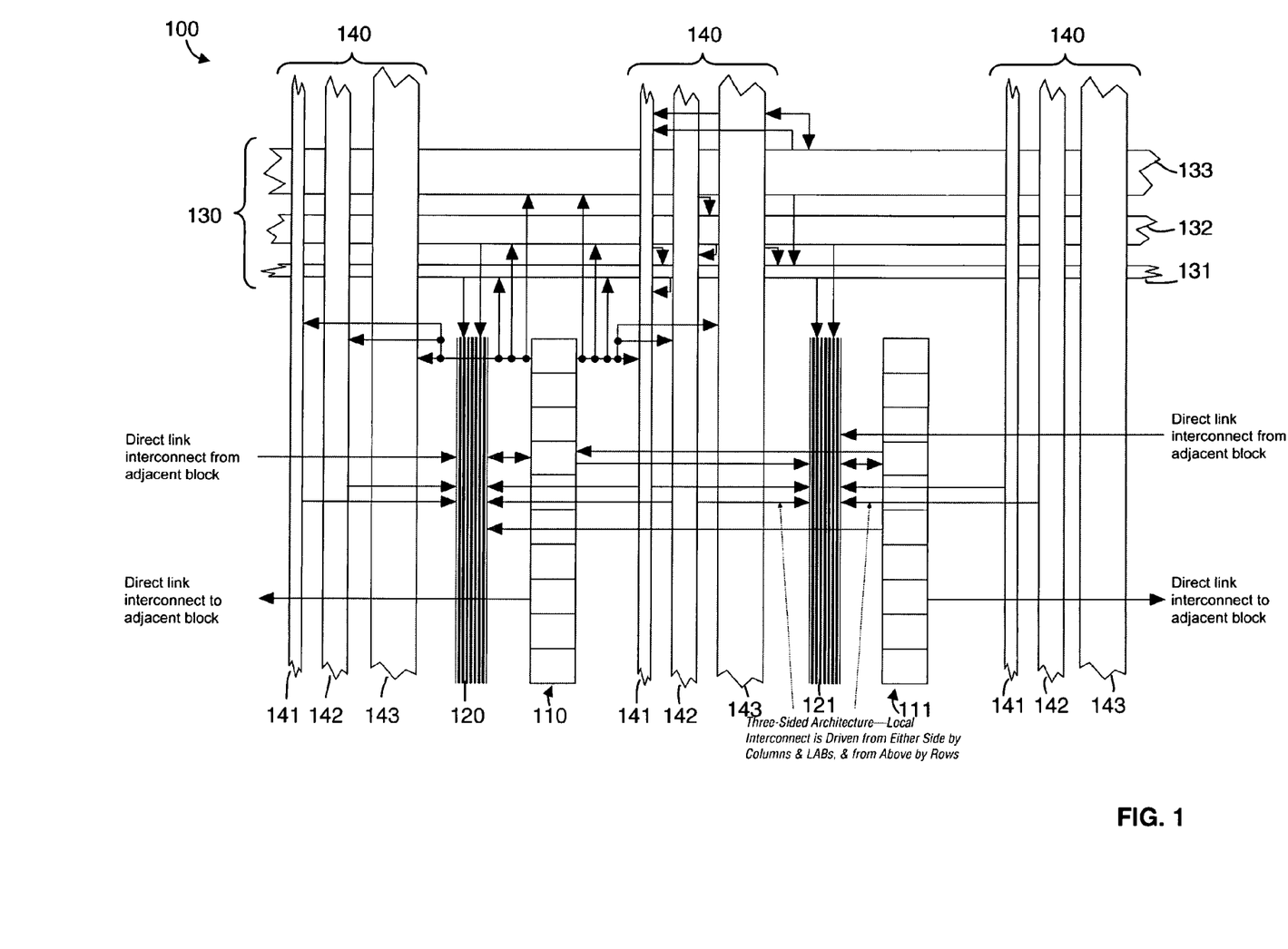
FIG. 1 illustrates a PLD according to an embodiment of the present invention.

FIG. 1 illustrates an exemplary target device 100 (PLD) according to an embodiment of the present invention. The present invention may be used to design a system onto the target device 100. According to one embodiment, the target device 100 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 100, an LE may include a 4-input lookup table (LUT) with a configurable flip-flop. It should be appreciated that an embodiment of the present invention may also apply to product-term or other programmable logic, and to application-specific circuits.

The exemplary target device 100 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 100. A first column of LABs is shown as 110 and a second column of LABs is shown as 111.

The target device 100 may include memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 100.

The target device 100 may include digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 100.

The target device 100 includes a plurality of input/output elements (IOEs) (not shown). Each IOE feeds an I/O pin (not shown) on the target device 100. The IOEs are located at the end of LAB rows and columns around the periphery of the target device 100, or can be embedded directly in the device core area. Each IOE may include a bidirectional I/O buffer and a plurality of registers for registering input, output, and output-enable signals. When used with dedicated clocks, the registers provide performance and interface support with external memory devices, for example.

The target device 100 includes LAB local interconnect lines 120-121 that transfer signals between LEs in the same LAB. The LAB local interconnect lines are driven by column and row interconnects and LE outputs within the same LAB. Neighboring LABs, memory blocks, IOEs, or DSP blocks may also drive the LAB local interconnect lines 120-121 through direct link connections.

The target device 100 also includes a plurality of row interconnect lines ("H-type wires") 130 that span fixed distances. Dedicated row interconnect lines 130, that include H4 131, H8 132, and H24 133 interconnects, route signals to and from LABs, DSP blocks, IOEs, and memory blocks within the same row. The H4 131, H8 132, and H24 133 interconnects span a distance of up to four, eight, and twenty-four LABs respectively, and are used for fast row connections in a four-LAB, eight-LAB, and twenty-four-LAB region. The row interconnects 130 may drive and be driven by LABs, DSP blocks, RAM blocks, and horizontal IOEs.

The target device 100 also includes a plurality of column interconnect lines ("V-type wires") 140 that operate similarly to the row interconnect lines 130. The column interconnect lines 140 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 140 include V4 141, V8 142, and V16 143 interconnects that traverse a distance of four, eight, and sixteen blocks respectively, in a vertical direction.

FIG. 1 illustrates one embodiment of the exemplary target device. It should be appreciated that a system may include a plurality of target devices, such as that illustrated in FIG. 1, cascaded together. It should also be appreciated that the target device may include programmable logic devices arranged in a manner different than that on the target device 100. A target device may also include components other than those described in reference to the target device 100. Thus, while the invention described herein may be utilized on the architecture described in FIG. 1, it should be appreciated that it may also be utilized on different architectures, such as those employed by Altera® Corporation in its APEX™, Mercury™, Stratix™ and Cyclone™, families of chips and those employed by Xilinx®, Inc. in its Virtex™, Virtex™II, Spartan™ and Spartan II™ families of chips. The target device also need not be a programmable logic device, and the invention applies to a larger class of devices including standard-cell application-specific integrated circuits, gate arrays, and mask-programmed and via-programmed gate-arrays.

Figure 2:
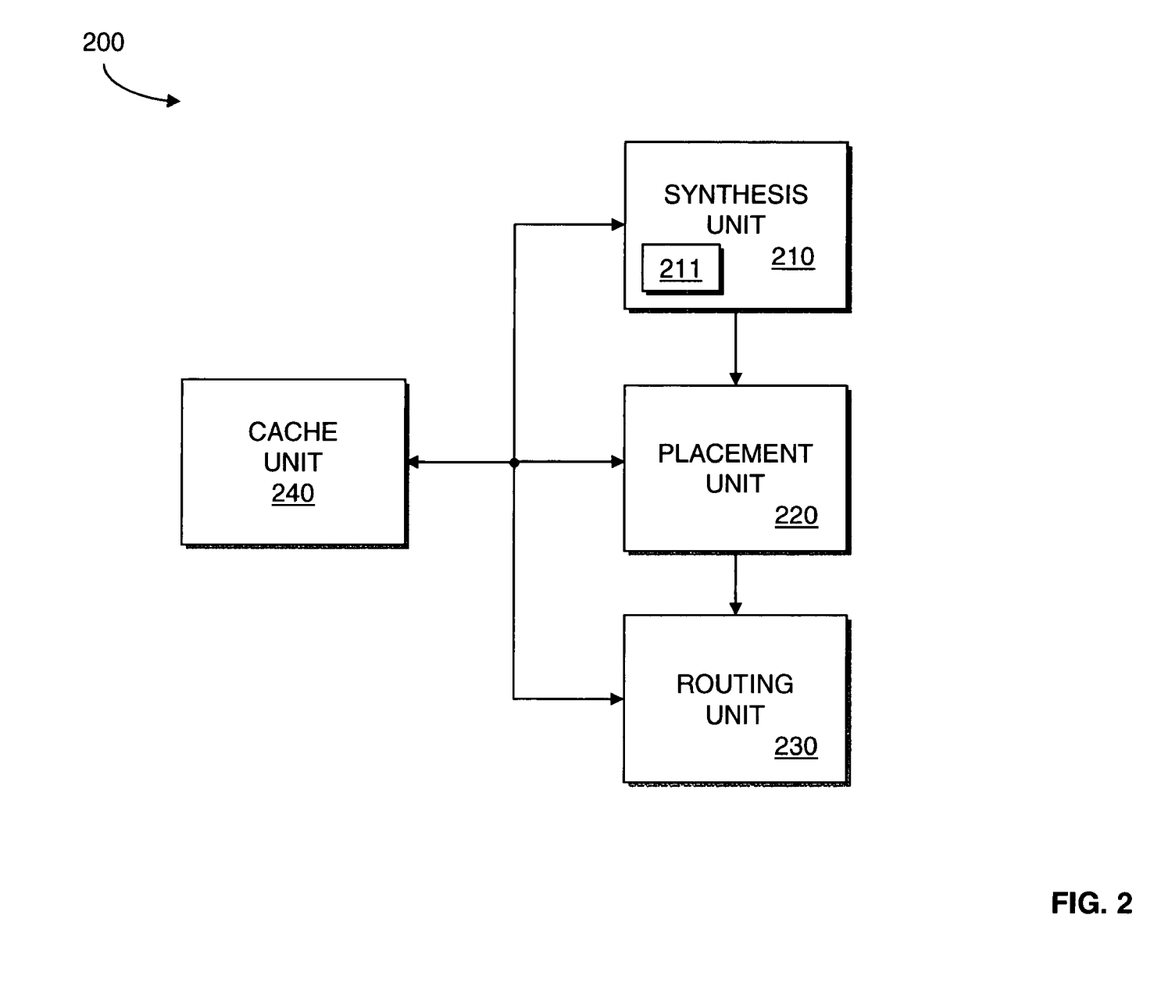
FIG. 2 illustrates a system designer according to an embodiment of the present invention.

FIG. 2 illustrates a system designer 200 according to an embodiment of the present invention. The system designer 200 may be an EDA tool. FIG. 2 illustrates software modules implementing an embodiment of the present invention. According to one embodiment, system design may be performed by a computer system (not shown) executing sequences of instructions represented by the software modules shown in FIG. 2. Execution of the sequences of instructions causes the computer system to support system design as will be described hereafter. In alternate embodiments, hardwire circuitry may be used in place of or in combination with software instructions to implement the present invention. Thus, the present invention is not limited to any specific combination of hardware circuitry and software.

Block 210 represents a synthesis unit. The synthesis unit 210 generates a logic design of a system to be implemented by the target device 100 (shown in FIG. 1). According to an embodiment of the system designer 200, the synthesis unit 210 takes a conceptual schematic or Hardware Description Language (HDL) design definition and generates an optimized logical representation of the system. The optimized logical representation of the system generated by the synthesis unit 210 may include a representation that has a minimized number of functional blocks and registers, such as logic gates and logic elements, required for the system. Alternatively, the optimized logical representation of the system generated by the synthesis unit 210 may include a representation that has a reduced depth of logic and that generates a lower signal propagation delay. The synthesis unit 210 also determines how to implement the functional blocks and registers in the optimized logic representation utilizing specific resources on the target device 100 thus creating an optimized "technology-mapped" netlist. The technology-mapped netlist illustrates how the resources on the target device 100 are utilized to implement the system. The technology-mapped netlist may, for example, contain components such as LEs on the target device 100.

According to an embodiment of the system designer 200, the synthesis unit includes a re-synthesis unit 211 that performs functional decomposition on the system. The re-synthesis unit 211 identifies a logic circuit in the netlist to evaluate and generates a functional representation of the logic circuit. The re-synthesis unit 211 determines an improved structural representation of the logic circuit from the functional representation. If the functional representation of the logic circuit has been recently evaluated, a structural representation of the logic circuit associated with the recently evaluated functional representation is designated as the improved representation of the logic circuit. The improved structural representation of the logic circuit is evaluated to determine whether it is a better design than the original logic circuit. If the improved structural representation is a better design, it is used to replace the original logic circuit.

Block 220 represents a placement unit. The placement unit 220 fits the system on the target device 100 by determining which resources on the target device 100 are to be used for specific functional blocks and registers. According to an embodiment of the system designer 200, the placement unit 220 first determines how to implement portions of the optimized logic design in clusters. Clusters may represent a subset of the components on the target device 100 such as, for example, a LAB having 10 LEs. In this embodiment, after portions of the optimized logic design are implemented in clusters, the clusters may be placed by assigning the clusters to specific LABs on the target device 100. Following the placement of the clusters, routing interconnections between the LEs may be performed. The placement unit 220 may utilize a cost function in order to determine a good assignment of resources on the target device 100.

Block 230 represents a routing unit. The routing unit 230 determines the routing resources on the target device 100 to use to provide interconnection between the functional blocks and registers on the target device 100.

Block 240 represents a caching unit. The caching unit 240 may be used to store design information collected during a compilation of a system design. According to an embodiment of the system designer 200, the caching unit 240 stores functional decomposition templates that include functional representations of logic circuits and their corresponding structural representations. As new information is written into the caching unit 240, the oldest information stored may be removed or erased according to individual requirements and the size-limit of the cache chosen.

Figure 3:
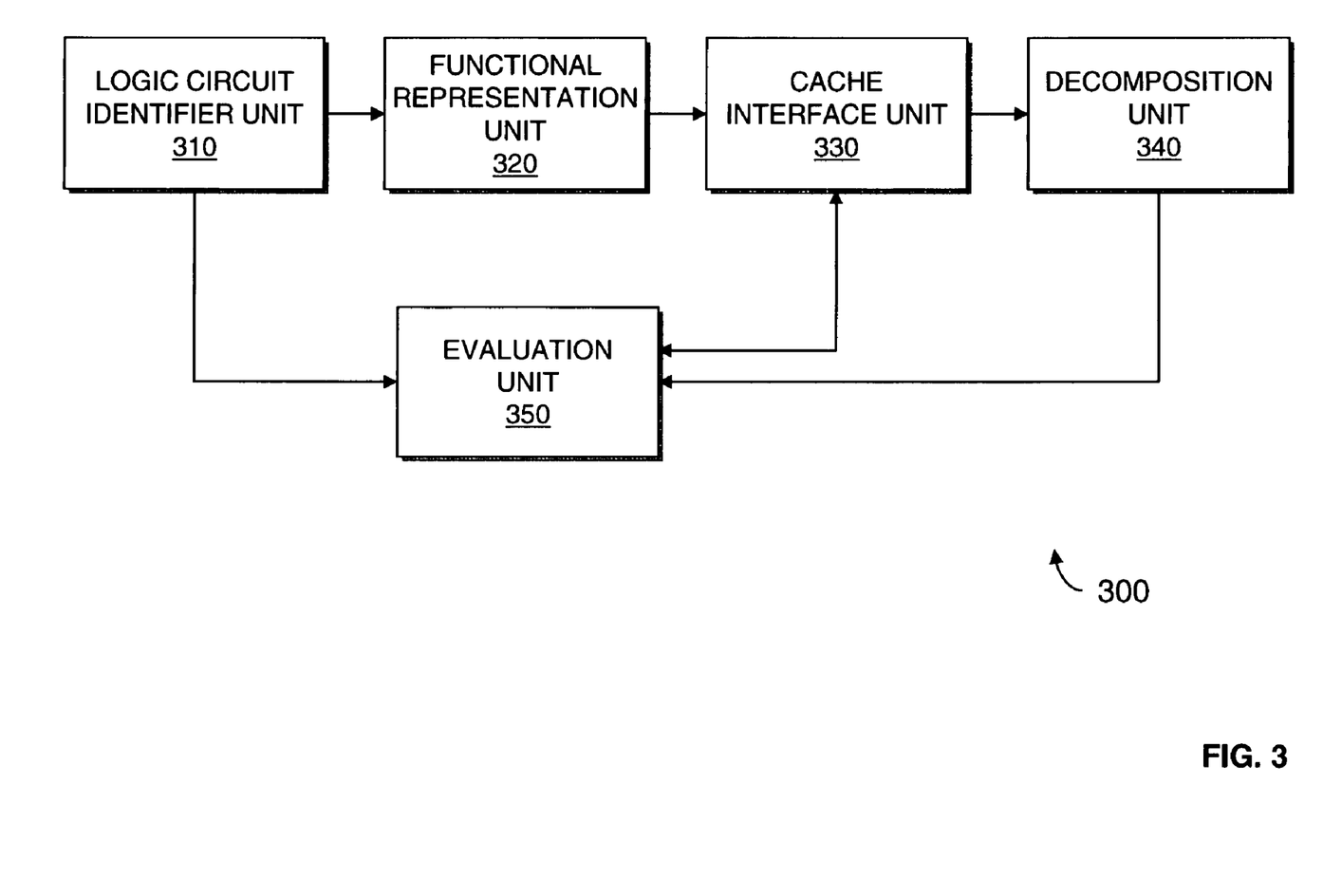
FIG. 3 is a block diagram of a re-synthesis unit according to an embodiment of the present invention.

FIG. 3 is a block diagram illustrating a re-synthesis unit 300 according to an embodiment of the present invention. The re-synthesis unit 300 may be used to implement the re-synthesis unit 211 illustrated in FIG. 2. Block 310 represents a logic circuit identifier unit. The logic circuit identifier unit 310 identifies logic circuits in the system to evaluate. According to an embodiment of the re-synthesis unit 300, the logic circuit identifier unit 310 identifies the maximum fanout free cones (MFFC) in the netlist describing the system. A fanout free cone may be described as a group of logic having a set of inputs and a single output. In one embodiment, the logic circuit identifier unit 310 identifies MFFCs having a predetermined number of inputs or less. For a MFFC having a number of inputs greater than the predetermined number, the logic circuit identifier unit 310 prunes the logic in the cone such that the number of inputs to the modified cone is within the predetermined number.

Block 320 represents a functional representation unit. The functional representation unit 320 generates a functional representation for the cones identified by the logic circuit identifier unit 310. According to an embodiment of the re-synthesis unit, the functional representation unit 320 generates a truth table describing the functionality of the logic circuit in each of the cones. The truth table may be, for example, a canonical 01 table. It may also be stored in a binary-decision diagram (BDD).

Block 330 represents a cache interface unit. The cache interface unit 330 determines whether a functional representation of a logic circuit has been recently evaluated by the re-synthesis unit 300. The cache interface unit 330 makes this determination by checking whether the functional representation of the logic circuit is stored in the cache unit 240 (shown in FIG. 2) with a structural representation of the logic circuit. If the functional representation for the logic circuit has been recently evaluated, a structural representation stored with the functional representation in the cache unit 240 is retrieved by the cache interface unit 330 and is designated as an improved structural presentation for the logic circuit. According to an embodiment of the re-synthesis unit 300, a hash value of the functional representation may be generated by the cache interface unit 330 and compared with other hash values in the cache unit 240. If a structural representation is stored with that hash value in the cache unit 240, it is determined that the corresponding functional representation has been recently evaluated. In this embodiment, the hash value may also be considered a functional representation of the logic circuit.

Block 340 represents a decomposition unit. The decomposition unit 340 receives the functional representation of a logic circuit if the functional representation has not been recently evaluated by the re-synthesis unit 300. From the functional representation of the logic circuit, the decomposition unit 340 considers other structural representations for the logic circuit and determines an improved structural representation. According to an embodiment of the re-synthesis unit 300, the decomposition unit 340 considers the number of resources, such as LUTs, used on the target device 100 (shown in FIG. 1) for a structural representation for the logic circuit when determining the improved structural representation.

Block 350 represents an evaluation unit. The evaluation unit 350 receives the original logic circuit from the logic circuit identifier unit 310 and the improved structural representation from either the cache interface unit 330 or the decomposition unit 340 and determines which has the better design for the system. According to an embodiment of the re-synthesis unit 300, the evaluation unit 350 determines whether the improved structural representation of the logic circuit requires fewer resources and/or is likely to facilitate less delay in signal propagation. If it is determined that the improved structural representation of the logic circuit requires fewer resources and/or is likely to facilitate less delay in signal propagation, the evaluation unit 350 replaces the original logic circuit with the improved logic circuit. The evaluation unit 350 also prompts the cache interface 330 to store the better design as the structural representation with its associated functional representation as a functional decomposition template (if the information is not already in the cache unit 240). It should be appreciated that the evaluation unit 350 may use other criteria such as circuit delay, interconnect utilization, power consumption or projected wiring congestion to determine whether to replace the original logic circuit with the new logic circuit.

It should be appreciated that the synthesis unit 210, placement unit 220, routing unit 230, and cache unit 240 in FIG. 2 and the logic circuit identifier unit 310, functional representation unit 320, and cache interface unit 330, decomposition unit 340, and evaluation unit 350 in FIG. 3 may be implemented using any known circuitry or technique. It should also be appreciated that not all the components shown in FIGS. 2 and 3 may be required to practice the present invention.

Figure 4:
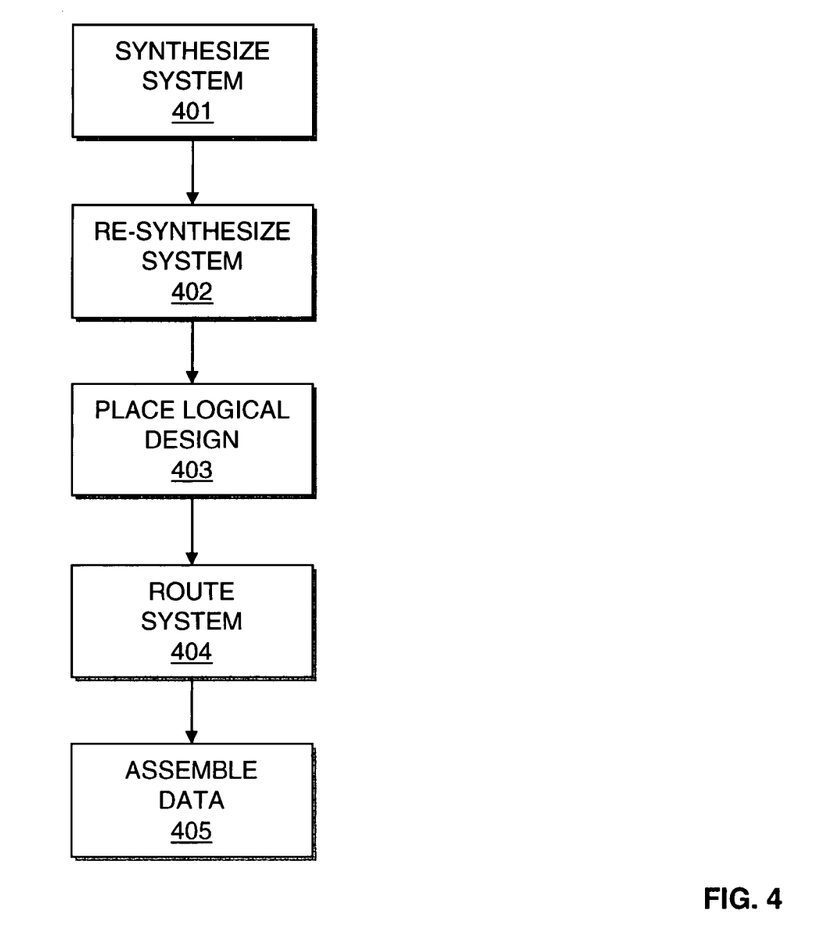
FIG. 4 is a flow chart illustrating a method for designing a system on a PLD according to an embodiment of the present invention.

FIG. 4 is a flow chart illustrating a method for designing a system on a PLD according to an embodiment of the present invention. At 401, the system is synthesized. Synthesis includes generating a logic design of the system to be implemented by a target device. According to an embodiment of the present invention, synthesis generates an optimized logical representation of the system from a HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 402, the system is re-synthesized. Re-synthesis includes performing functional decomposition of selected logic circuits in the system. An example of re-synthesis is described in "Boolean Matching for Complex PLBs in LUT-based FPGAs with Application to Architecture Evaluation", Jason Cong and Yean-Yow Huang, Proceedings of the 1998 ACM Conference on Field-Programmable Gate Arrays. According to an embodiment of the present invention, functional decomposition involves generating a functional representation of an identified logic circuit in the system and determining an improved structural representation for the logic circuit from the functional representation. If the functional representation of the logic circuit has been recently evaluated, a structural representation associated with the recently evaluated functional representation is designated as the improved structural representation. The improved structural representation is evaluated to determine whether it is a better design than the original logic circuit. If the improved structural representation is a better design, it replaces the original logic circuit.

At 403, the mapped logical system design is placed. Placement works on the optimized technology-mapped netlist to produce a placement for each of the functional blocks. According to an embodiment of the present invention, placement includes fitting the system on the target device by determining which resources on the target device is to be used for specific logic elements, other function blocks, and some connections between the logic elements and the other function blocks.

At 404, it is determined which routing resources should be used to connect the functional blocks in the system. According to an embodiment of the present invention, routing may be performed in response to routing constraints provided.

At 405, an assembly procedure is performed. The assembly procedure involves creating a data file that includes information determined by the fitting procedure described by 401-404. The data file may be a bit stream that may be used to program the target device.

Figure 5:
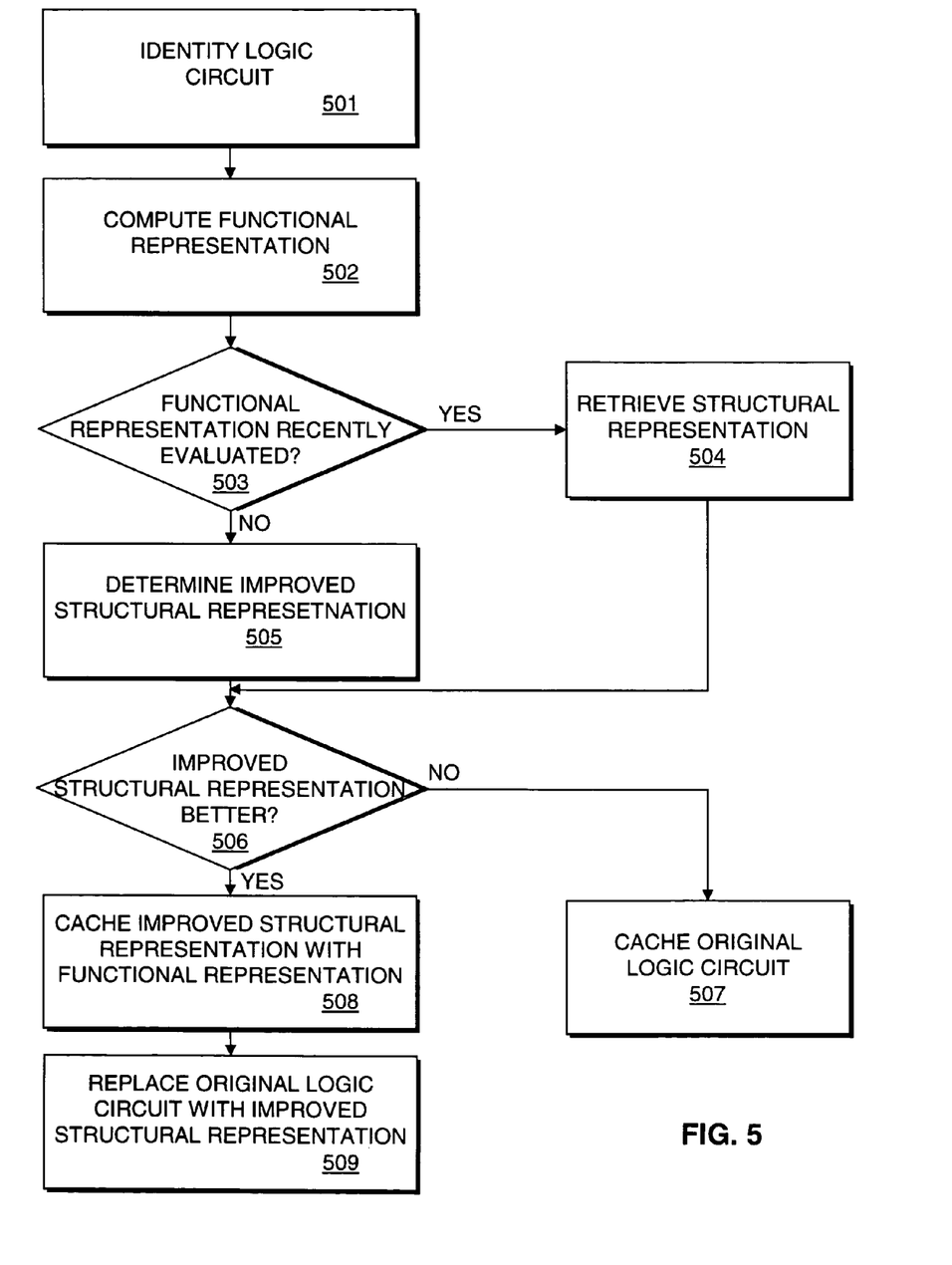
FIG. 5 is a flow chart illustrating a method for performing re-synthesis according to an embodiment of the present invention.

FIG. 5 is a flow chart illustrating a method for performing re-synthesis according to an embodiment of the present invention. This method may be used to implement 402 as shown in FIG. 4. At 501, a logic circuit in a system is identified to be evaluated. According to an embodiment of the present invention, the logic circuit is identified by finding the MFFCs in the system. The logic circuit is selected from MFFCs having equal or less than a predetermined number of inputs. In one embodiment, a MFFC having more than the predetermined number of inputs may have circuitry pruned in order that its number of inputs is within the predetermined number.

At 502, a functional representation of the logic circuit is generated. According to an embodiment of the present invention, the functional representation may be a truth table. The truth table may be, for example, a canonical 01 table. It should be appreciated that other types of functional representations may be generated.

At 503, it is determined whether the functional representation has recently been evaluated. According to an embodiment of the present invention, the determination may be achieved by performing a hash function on the functional representation to generate a hash value and searching a cache to determine whether a functional representation with that hash value has a corresponding structural representation stored with it. If a functional representation with that hash value has a corresponding structural representation stored with it, it may be determined that the functional representation has recently been evaluated. According to an alternate embodiment of the present invention, the determination may be achieved by searching the cache to determine whether the functional representation is stored. In this embodiment, the functional representation may be the actual functional representation determined at 502 or a hash of the representation. If the functional representation has recently been evaluated, control proceeds to 504. If the functional representation has not been recently evaluated, control proceeds to 505.

At 504, the structural representation corresponding to the functional representation is retrieved from the cache and is designated as the improved structural representation of the logic circuit. Control proceeds to 506.

At 505, an improved structural representation of the logic circuit is determined from the functional representation of the logic circuit. According to an embodiment of the present invention, possible structural representations for the logic circuit are evaluated based upon the number of resources, such as LUTs, required to implement the structural representation on a target device. It should be appreciated that other criteria may such as delay, wiring congestion or estimates of power consumption of the circuit be used to evaluate the possible structural representations.

At 506, it is determined whether the improved structural representation is a better design than the original logic circuit. According to an embodiment of the present invention, this may be achieved by determining whether the improved structural representation of the logic circuit requires fewer resources to implement and/or is likely to facilitate less delay in signal propagation. It should be appreciated that other criteria may be considered to determine whether the improved structural representation is a better design. If it is determined that the improved structural representation is not a better design, control proceeds to 507. If it is determined that the improved structural representation is a better design, control proceeds to 508.

At 507, the original design is unchanged. The original design is cached with its functional representation as a functional decomposition template.

At 508, the improved structural representation of the logic circuit is cached with its functional representation as a functional decomposition template (if the information has not already been cached). According to an embodiment of the present invention, if new information needs to be written into the cache, the oldest information in the cache is removed. According to other embodiments of the invention more complicated caching algorithms may be used.

At 509, the improved representation of the logic circuit replaces the original logic circuit.

The procedure shown in FIG. 5 may be repeated until all logic circuits identified in 501 are evaluated according to procedures 502-509. Alternatively, the logic circuits identified in 501 may be grouped into a plurality of subsets where one subset is evaluated during each compilation of the system design. When all the logic circuits are evaluated during a compilation, the run-time of the first compilation is typically the longest. By dividing the re-synthesis step among a plurality of compilation, the run-time of the first compilation is averaged with the run-time of subsequent compilations.

FIGS. 4 and 5 are flow charts illustrating methods according to embodiments of the present invention. The techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

By caching design information such as structural and functional representations of a logic circuit, the system designer 200 (shown in FIG. 2) may perform re-synthesis more efficiently. Previously determined improved structural representations of a logic circuit may be used in subsequent evaluations to reduce the overall compilation time of a system design. It should be appreciated that the design information stored in the cache unit 240 may be used in many ways. According to an embodiment of the present invention, cached design information may be used in a current compilation for a system design. Design information from a previous compilation may also be cached and utilized in a subsequent compilation for the system design. Design information from a previous compilation(s) of a previous system design(s) may also be utilized in a subsequent compilation of a new system design. It should be appreciated that design information for system designs by more than one user may be cached and utilized locally or remotely. In this embodiment of the present invention, the design information could be updated so that local and remote utilization can be kept current.

Figure 6:
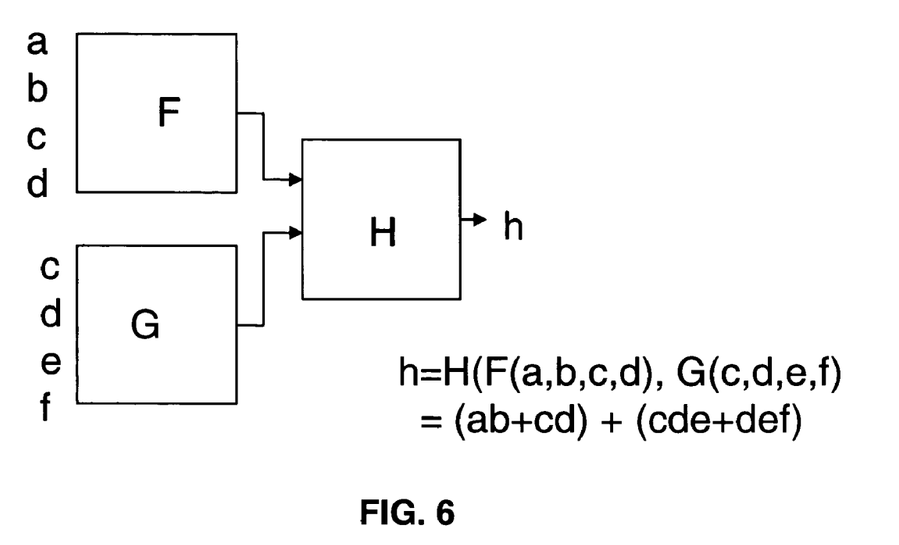
FIG. 6 is an example of a logic circuit determined to be re-synthesized according to an embodiment of the present invention.

FIG. 6 illustrates an exemplary logic circuit determined to be re-synthesized according to an embodiment of the present invention and its functional representation as a Boolean equation.

Figure 7:
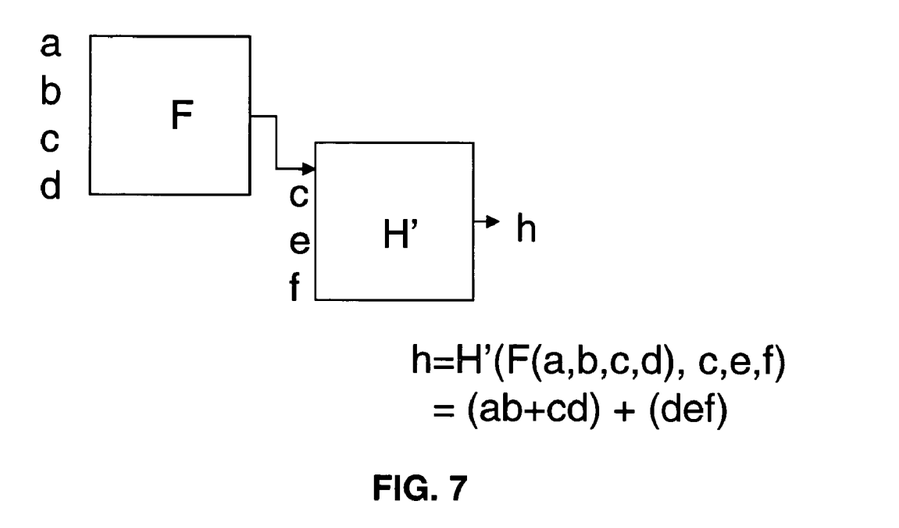
FIG. 7 is an example of an improved structural representation of the logic circuit shown in FIG. 6 according to an embodiment of the present invention.

FIG. 7 illustrates an exemplary improved representation of the logic circuit shown in FIG. 6 according to an embodiment of the present invention. The functional representation technique will determine that the cube cde in G is covered by the cube cd in F and thus find a more efficient decomposition using only two logic elements.

Although embodiments of the present invention have been shown with reference to re-synthesis, it should be appreciated that other components in the system designer 200 may utilize the cache unit 240 to store and retrieve other types of design information in order to reduce the overall compilation time of a system design. For example, components in the system designer 200 may cache information regarding components on the system design satisfying a wild-card constraint description such as might be input to timing analysis, information determined by previous compilations regarding path types and their degree of criticality (Edge Masks), information regarding resource allocation (EAM, Pins), information regarding placement information from previous compiles (Automatic Incremental Compile), and information regarding delay of a path in the target device (Fitter Delay Cache). This information may be utilized during current or subsequent compilations in order to reduce the overall compilation run-time.

It is a well-known property of heuristic algorithms that often one approach or parameterization of an algorithm can provide superior results on one input circuit, while providing inferior results on a different circuit. It is computationally expensive to try all possible approaches on all circuits in every compile. According to one embodiment of this invention components in the system designer 200 will attempt one or more approaches or parameterizations that are not part of the default compilation flow, and cache the effectiveness of that approach, allowing future compilations to re-use only the best approaches for the current input circuit. For example, the effectiveness of an approach may be cached by storing an identity of an algorithm that was effective or ineffective in the system design. In these additional embodiments of the invention is clear that the invention has wide-ranging applicability to many problems in electronic design automation for circuits.

Embodiments of the present invention (e.g. exemplary process described with respect to FIGS. 4 and 5) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing systems, comprising:
identifying a logic circuit in the system design with an initial structural representation to re-synthesize;
generating a functional representation of the logic circuit;
determining an improved structural representation of the logic circuit that implements the functional representation of the logic circuit with a fewer number of look up tables than the initial structural representation;
storing the improved structural representation of the logic circuit with the functional representation of the logic circuit; and
utilizing the improved structural representation of the logic circuit in a compilation of a subsequent system design.

2. The method of claim 1, wherein identifying logic circuit in the system design to re-synthesize comprises identifying maximum fanout free cones (MFFCs) in the system design.

3. The method of claim 2, further comprising identifying the MFFCs having less than a selected number of inputs to the logic circuit in the system design to re-synthesize.

4. The method of claim 1, wherein determining the improved structural representation of the logic circuit comprises considering a delay associated with a logic circuit implementing the functional representation of the logic circuit.

5. The method of claim 1, further comprising storing an identity of an ineffective algorithm.

6. The method of claim 1, further comprising storing an identity of an algorithm that was effective in the system design.

7. The method of claim 1, further comprising storing information regarding components on the system design satisfying a description with a wild-card.

8. The method of claim 1, further comprising storing information regarding paths that go through a node in the system design.

9. The method of claim 1, further comprising storing information regarding resource allocation.

10. The method of claim 1, further comprising storing information regarding critical paths.

11. The method of claim 1, further comprising storing information regarding delay of a path.

12. The method of claim 1, wherein a plurality of logic circuits is identified and functional representations of a first subset of the plurality logic circuits are computed during a first compilation.

13. The method of claim 12, wherein a second subset of the plurality of logic circuit are computed during a second compilation.

14. The method of claim 1, wherein determining the improved structural representation of the logic circuit comprises considering power consumption associated with a logic circuit implementing the functional representation of the logic circuit.

15. The method of claim 1, wherein determining the improved structural representation of the logic circuit comprises considering interconnect utilization associated with a logic circuit implementing the functional representation of the logic circuit.

16. The method of claim 1, wherein utilizing the improved representation of the logic circuit comprises:
identifying a second logic circuit in a second system design to re-synthesize;
generating a functional representation of the second logic circuit;
determining that the functional representation of the second logic circuit is equivalent to the functional representation of the logic circuit; and
determining whether the improved structural representation of the logic circuit should be used for the second logic circuit.

17. The method of claim 16, further comprising replacing the second logic circuit with the improved structural representation of the logic circuit.

18. The method of claim 16, wherein determining whether the improved structural representation of the logic circuit should be used for the second logic circuit comprises comparing a number of look up tables required to implement the second logic circuit and the number of look up tables required to implement the improved structural representation of the logic circuit.

19. The method of claim 16, wherein determining whether the improved structural representation of the logic circuit should be used for the second logic circuit comprises considering a delay associated with implementing the second logic circuit and a delay associated with implementing the improved structural representation of the logic circuit.

20. The method of claim 1, further comprising performing synthesis on the system design before identifying the logic circuit in the system to re-synthesize.

21. The method of claim 1, further comprising performing placement on the system before identifying the logic circuit in the system to re-synthesize.

22. The method of claim 1, wherein the functional representation of the logic circuit is a truth table.

23. The method of claim 22, further comprising computing a hash of the truth table.

24. A machine-readable storage device having stored thereon sequences of instructions, the sequences of instructions including instructions which, when executed by a processor, causes the processor to perform:
    identifying a logic circuit in the system design with an initial structural representation to re-synthesize;
    generating a functional representation of the logic circuit;
    determining an improved structural representation of the logic circuit that implements the functional representation of the logic circuit with a fewer number of look up tables than the initial structural representation;
    storing the improved structural representation of the logic circuit with the functional representation of the logic circuit; and
    utilizing the improved structural representation of the logic circuit in a compilation of a subsequent system design.

25. The method of claim 1, wherein the systems are designed on field programmable gate arrays.

26. The machine-readable storage device of claim 24, wherein the functional representation of the logic circuit is a truth table.

27. The method of claim 26, wherein the truth table is represented as a 01-table.

28. The method of claim 26, wherein the truth table is a represented as a binary-decision diagram.

29. A method for designing systems, comprising:
    identifying a logic circuit in a system design with an initial structural representation to re-synthesize;
    generating a functional representation of the logic circuit with a fewer number of look up tables than the initial structural representation;
    identifying an algorithm that was effective in designing the logic circuit;
    storing an identity of the algorithm with the functional representation of the logic circuit; and
    utilizing the algorithm in a compilation of a subsequent system design having the logic circuit.

30. The method of claim 29, wherein identifying the algorithm comprises considering a delay associated with a logic circuit implementing the functional representation of the logic circuit.

31. The method of claim 29, wherein utilizing the algorithm in a compilation of a subsequent design having the logic circuit:
    identifying a second logic circuit in a second system design to re-synthesize;
    computing a truth table as a functional representation of the second logic circuit;
    determining that the functional representation of the second logic circuit is equivalent to the functional representation of the logic circuit; and
    utilizing the algorithm to design the second logic circuit.

32. The method of claim 29, wherein the functional representation of the logic circuit is a truth table.

33. The method of claim 32, further comprising computing a hash of the truth table.

34. A method for designing a system on a target device, comprising:
    performing synthesis on a system design;
    identifying a logic circuit in a system design with an initial structural representation to re-synthesize;
    generating a functional representation of the logic circuit;
    determining an improved structural representation of the logic circuit that implements the logic circuit with a fewer number of look up tables than initial structural representation; and
    storing the improved structural representation of the logic circuit with the functional representation of the logic circuit.

35. The method of claim 34, further comprising performing placement on the system design before identifying the logic circuit in the system design to re-synthesize.

36. The method of claim 34, further comprising:
    determining whether the functional representation of the logic circuit is stored when designing a subsequent system; and
    utilizing the improved structural representation of the logic circuit in a compilation of the subsequent system.

* * * * *